United States Patent [19]

Schwede

[11] 4,103,318

[45] Jul. 25, 1978

[54] ELECTRONIC MULTICHIP MODULE

[75] Inventor: Otto G. Schwede, Los Altos, Calif.

[73] Assignee: Ford Motor Company, Dearborn, Mich.

[21] Appl. No.: 794,586

[22] Filed: May 6, 1977

[51] Int. Cl.² ............................................. H05K 7/20
[52] U.S. Cl. .................................. 361/388; 361/389; 339/17 LM
[58] Field of Search ............... 339/17 LM, 17 M, 112; 357/74, 75, 81; 361/380, 381, 386, 388, 389, 424, 392, 410

[56] References Cited

U.S. PATENT DOCUMENTS

| 3,287,604 | 11/1966 | Mroz | 361/389 |
|---|---|---|---|
| 3,328,642 | 6/1967 | Havmesser | 361/389 |
| 3,596,140 | 7/1971 | Walsh | 339/17 M |
| 3,839,660 | 10/1974 | Stryker | 357/81 |
| 3,909,678 | 9/1975 | Kifkin | 339/17 LM |

*Primary Examiner*—Gerald P. Tolin
*Attorney, Agent, or Firm*—Robert W. Brown; Clifford L. Sadler

[57] ABSTRACT

An electronic multichip module suitable for use in a hostile environment. The module includes a metallic base member and a metallic cover hermetically and metallically sealed to the base member, the base member and cover together forming an enclosure. Spaced metallic support members are located within the enclosure and a plurality of integrated circuit units are stacked, in sandwich fashion, between the support members. The integrated circuit units each include a metal plate extending between the support members and an integrated circuit chip mounted thereon in heat conductive relationship. The metal plate, the support members and the enclosure form a heat sink for the integrated circuit units and the enclosure provides a low cost hermetic seal for the entire assembly of integrated circuit units. Planar arrays of conductive elements may be utilized to interconnect the integrated circuit chip to the terminals of the integrated circuit units. Means, such as pin connectors penetrating through the enclosure and attached conductors, provide electrical access to the terminals of the integrated circuit units within the enclosure.

4 Claims, 4 Drawing Figures

U.S. Patent  July 25, 1978  4,103,318
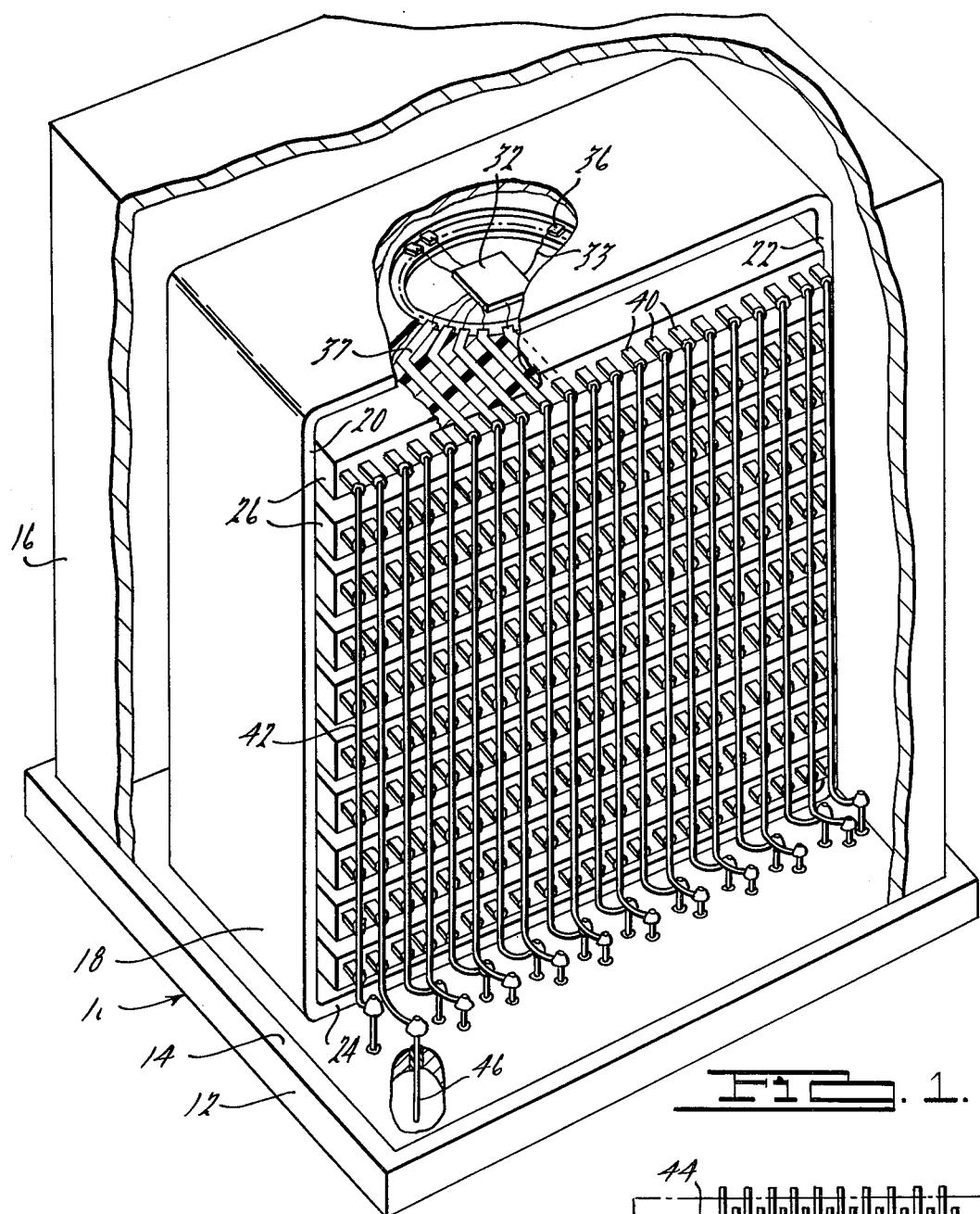
FIG. 1.
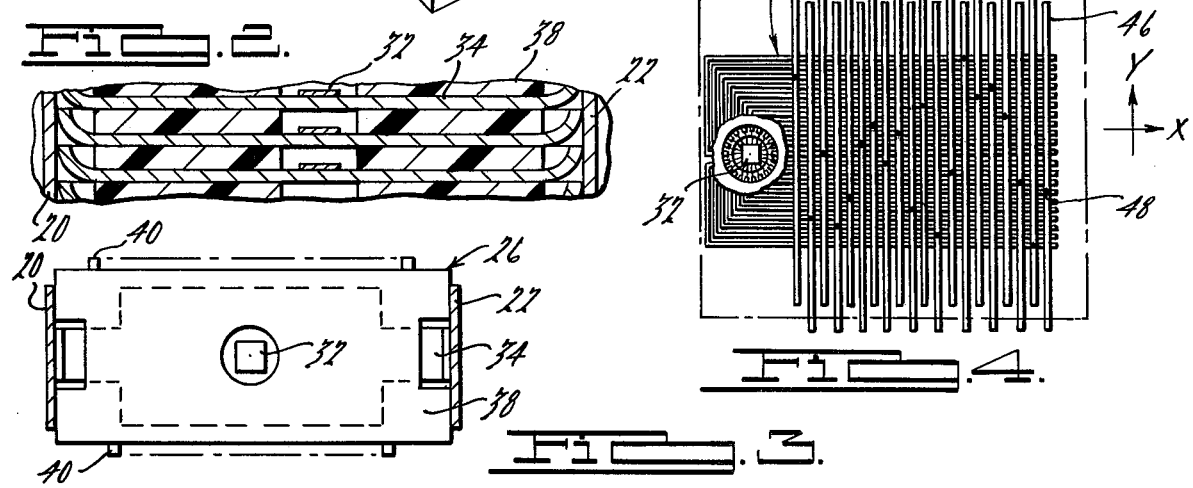
FIG. 2.
FIG. 3.
FIG. 4.

ELECTRONIC MULTICHIP MODULE

BACKGROUND

This invention relates to an electronic multichip module suitable for use in a hostile environment, and, more particularly, to a module including a plurality of integrated circuit units assembled in sandwich fashion within an enclosure that provides a heat sink for the energy dissipated by the electronic circuits and which simultaneously provides a hermetic seal of the entire assembly. The electronic multichip module may be used in the engine compartment of a motor vehicle, where temperature may range from −40° C. to 125° C. and where such conditions as salt spray, wetness, high humidity, severe electrical transients, and random electromagnetic radiation are encountered.

Complex electronic systems are finding increasing application in motor vehicles. The use of large-scale integrated circuits in multiple chip configurations capable of providing digital computer control of engine operation and other motor vehicle functions have been proposed. The present invention provides an electronic multichip module that may be utilized in such complex motor vehicle electronic systems.

Electronic multichip modules have been described in the prior art. For example, in U.S. Pat. No. 3,184,649 to Singletary there is shown a circuit assembly including a plurality of hermetically sealed semiconductor elements stacked, in sandwich fashion, with thermally-conductive "universal units" located between the various circuit elements. A plate may be provided along side the stacks for additional conduction and the entire unit may be encapsulated in a plastic body. Additional patents of particular interest with respect to the present invention are U.S. Pat. No. 3,801,728 to Gallo et al and U.S. Pat. No. 3,764,856 to Martin. The Gallo patent illustrates apparatus and a method for manufacturing single-chip integrated circuit packages, and the Martin patent illustrates a stacking arrangement for electronic packages having leads extending into thermal contact with a thermal sink.

SUMMARY OF THE INVENTION

In accordance with the invention, an electronic multichip module comprises, in combination, a metallic base member and a metallic cover together forming an enclosure. A plurality of integrated circuit units, which are not hermetically sealed, are positioned between metallic support members within the enclosure. The support members are thermally conductive and in thermal contact with the metallic base member. Each of the integrated circuit units includes a metal plate that extends between the support members and that is in heat conductive relation with them. An integrated circuit chip is positioned on and in thermal contact with the metal plate, which therefore provides a heat sink for it, as do the support members and the base member and cover to which the support members are attached. An insulator is positioned on the metal plate of each integrated circuit unit and conductive electrical elements connected to the integrated circuit chip have terminals extending beyond opposite edges of the metal plate. Parallel arrays of electrical conductors are connected to the terminals of the integrated circuit units. Also, means, extending through the enclosure and electrically isolated from it, are provided for permitting electrical connections to be made to the integrated circuit units within the enclosure.

The invention may be better understood by reference to the detailed description which follows and to the drawings.

BRIEF DESCRIPTION OF THE DRAWINGS

FIG. 1 is an enlarged perspective view of an electronic multichip module;

FIG. 2 is a sectional elevational view of several integrated circuit units and of the members used to support them;

FIG. 3 is a plan view of an integrated circuit unit and the members used to support it; and FIG. 4 is a plan view of a planar array of electrical conductors that, as an alternative form of the integrated circuit unit, interconnect its terminals with those of an integrated circuit chip in the unit.

DETAILED DESCRIPTION

With reference now to the drawings, wherein like numerals refer to like parts in the several views, there is shown an electronic multichip module generally designated by the numeral 10. In the embodiment of the invention illustrated in the drawing, the module 10 includes a thermally and electrically conductive base member 12 that is flat except for a lip 14 extending around its periphery. A cup-shaped, thermally-conductive, metallic cover 16 has an open end that is in contact with the base member 12 and has its outer surface in contact with the inner surface of the lip 14. At the junction between the metal cover 16 and the base member 12, a hermetic seal is formed. Other attachment means may be used for securing the cover to the base member as may be dictated by economic and manufacturing considerations. For example, the open end of the cover can be formed with a flange that can be welded to the base member.

The base member 12 and metal cover 16 together form a thermally-conductive and hermetically sealed enclosure. Within this enclosure, there is positioned a support structure 18 having parallel and spaced apart legs 20 and 22 extending upwardly from the base member 12 to which the bottom portion 24 of the support structure is suitably secured, for example, by welding. The support structure 18 is made from a metal or other material having high thermal and electrical conductivity. The large area of contact between the support structure 18 and the base member 12 enhances the heat transfer characteristics of the assembly. The enclosure formed by the metal base member 12 and the metal cover 16 shields the circuitry within from electromagnetic radiation and, if made from ferromagnetic materials, provides magnetic shielding as well.

The legs 20 and 22 of the support structure provide the support for a plurality of integrated circuit units 26 that extend between the spaced and parallel legs 20 and 22. In FIG. 1, ten integrated circuit units 26 are illustrated and are stacked in sandwich fashion. Each of the integrated circuit units includes an integrated circuit chip 32 mounted on a thermally-conductive metal plate 34, which facilitates heat transfer from the integrated circuit chip to the metal plate. Metallic pads (not shown) on the integrated circuit chip 32 are electrically connected by whisker wires 33 to exposed ends 36 of a unit interconnect structure comprising conductive elements 37 embedded within an electrical insulator 38 attached to the metal plate 34. The other ends of these conductive elements, terminals 40, extend beyond the edges of the insulator 38 and metal plate 34 of each integrated circuit unit on both sides thereof, as is conventional in the packaging of integrated circuit units. The integrated circuit units 26 may be attached to the members 20 and 22 by any suitable means, but the metal plate 34 of each integrated circuit unit should be in thermal contact with the members 20 and 22 to provide thermal conductivity therebetween. The integrated circuit units 26 may be positioned upon each other and supported by spring friction of the metal plates 34 within the support structure.

Other configurations of support structure and integrated circuit units may be preferred for manufacturing ease. For example, the support structure 18 may have only one of the legs 20 or 22, and the metal plates 34 of the integrated circuit units 26 may extend beyond the insulator 38 and be inserted into slits or channels in the leg of the support structure.

Conductors 42, forming two module interconnect arrays, are provided for electrically interconnecting the terminals 40 of the integrated circuits units 26 and conductive pins 46 penetrating and extending through the base member. This permits connection of external circuitry to the circuitry within the enclosure formed by the base member 12 and cover 16. The pins 46 pass through openings in the base member which are hermetically sealed and which are filled with nonconductive material to electrically isolate the pins 46 from the base member 12. One of the module interconnect arrays is shown in FIG. 1 where the electrical conductors lie in a plane parallel to the sides of the integrated circuits units from which the terminals 40 project. A similar array is positioned on the opposite side of the integrated circuit units to permit interconnection of the terminals extending from the backside of these units. The conductors 42 are connected to the terminals 40 of the integrated circuit units 26 by well-known welding techniques. Of course, soldering or other electrical connecting schemes may be employed.

In the manufacture of these modules the terminals 40 of the various integrated circuit units bearing identical signals or supply voltages are preferably positioned adjacent to one another to facilitate unit interconnecting by permitting the conductors 42 to be parallel to each other. However, the different semiconductor chips 32 required in the assembly of the electronic multichip module 10 may have a geometrical arrangement of pads 36 that does not permit this preferred arrangement of terminals 40 when using a single conventional lead frame. This disadvantage is overcome in the embodiment of the unit interconnect structure depicted in FIG. 4. FIG. 4 shows two planar sets of electrical leads 44 and 46 superimposed upon each other. Lead set 44 is an array of essentially parallel conductors 44 extending in the X-direction. The other lead set 46 is an array of parallel conductors extending in the Y-direction. The two lead sets are insulated from each other by a thin insulating layer (not shown). Connections are made between the X-oriented and Y-oriented conductors at selected crossing points 48 by pressure welding through the insulating layer. The welded lead frames are then embedded in the insulator 38 thus forming the unit interconnect structure. This unit interconnect structure lends itself to fabrication as a unit outside of the module on automated equipment where large volume production of these assemblies 10 is desired.

Other methods of connecting the X-oriented and Y-oriented conductors can be envisioned. The thin insulating layer may have holes at the selected crossing points 48 and the interconnections may be made by metal-to-metal welding, soldering or other means. The X-conductors may be cut off to the right of the connecting points 48 and the Y-conductors on their nonterminal sides. The Y-oriented conductors may be wires with insulating sleeves, which would permit elimination of the thin insulating layer between the lead sets. Also, the Y-oriented insulated wires may be interwoven with the X-oriented conductors. The arrangement in FIG. 4 has the integrated circuit chip 32 positioned off-center. This off-center position of the chip is not reflected in FIGS. 1, 2 and 3 where a central positioning of the chip 32 is shown.

Based on the foregoing description of the invention, what is claimed is:

1. An electronic multichip module, which comprises, in combination:
   a metallic base member;
   a metallic cover hermetically sealed to said base member, said base member and said cover together forming an enclosure;
   at least one metallic support member within said enclosure and attached thereto;
   a plurality of integrated circuit units, each of said units comprising: a metal plate supported by said support member and in heat conductive relation with said support member; an integrated circuit chip mounted on said metal plate to permit heat transfer from said integrated circuit chip to said metal plate; an insulator on said metal plate; a plurality of electrically-conductive elements insulated from said metal plate by said insulator and having terminal portions extending beyond said insulator and metal plate, said conductive elements being electrically isolated from said metal plate by said insulator; and means for electrically connecting said conductive elements to said integrated circuit chip;
   means for electrically interconnecting said terminal portions of said conductive elements of said integrated circuit units; and
   electrically conductive means, extending through said enclosure and electrically isolated thereform, for permitting electrical connection of circuitry external of said enclosure to be made to said means for electrically interconnecting said terminal portions of said conductive elements of said integrated circuit units.

2. An electronic multichip module according to claim 1 wherein said plurality of electrically conductive elements comprises two planar lead sets insulated from each other, conductors of one lead set being connected to conductors of the other lead set at selected crossing points.

3. An electronic multichip module according to claim 2 wherein said planar interconnected lead sets are embedded in said insulator on said metal plate.

4. An electronic multichip module according to claim 1 wherein said integrated circuit units are stacked in sandwich fashion whereby said terminals thereof extending beyond said insulators and base plates and intended to have identical signals or supply voltages are arranged adjacent to each other in a straight line.

* * * * *